United States Patent [19]
Nishino et al.

[11] Patent Number: 5,232,905
[45] Date of Patent: Aug. 3, 1993

[54] HIGH $T_c$ SUPERCONDUCTING DEVICE WITH WEAK LINK BETWEEN TWO SUPERCONDUCTING ELECTRODES

[75] Inventors: Toshikazu Nishino, Kawasaki; Haruhiro Hasegawa, Kokubunji; Ushio Kawabe, Tokyo, all of Japan

[73] Assignee: Hitachi, Ltd., Tokyo, Japan

[21] Appl. No.: 742,524

[22] Filed: Aug. 7, 1991

Related U.S. Application Data

[63] Continuation of Ser. No. 145,315, Jan. 19, 1988, abandoned.

[30] Foreign Application Priority Data

Jan. 30, 1987 [JP] Japan .................................. 62-18393
Apr. 13, 1987 [JP] Japan .................................. 62-88804

[51] Int. Cl.$^5$ ...................... H01B 12/00; H01L 29/06; H01L 39/22
[52] U.S. Cl. .......................................... 505/1; 257/33; 257/34; 257/35; 257/38; 505/702
[58] Field of Search ..................... 357/5; 505/704, 705, 505/740, 778, 1, 702; 324/248; 257/33, 34, 35, 36, 37, 38, 39

[56] References Cited

U.S. PATENT DOCUMENTS 4,864,237  9/1989  Hoenig ............................... 324/248

FOREIGN PATENT DOCUMENTS 0160456  11/1985  European Pat. Off. ............... 357/5
0274407   7/1988  European Pat. Off. ............. 257/33
58-157181  9/1983  Japan ................................ 357/5

OTHER PUBLICATIONS

Japanese Journal of Applied Physics 26 (1987) Jul., No. 7, Part II, "Observation of the Josephson Effect in Y-Ba-Cu-O Compound", by Higashino et al, pp. L1211-L1213.
Appl. Phys. Lett. 51(13), Sep. 28, 1987, "Preparation and substrate reactions of superconducting Y-Ba-Cu-O films" by Gurvitch et al., pp. 1027-1029.
Appl. Phys. Lett. 51(15), Oct. 12, 1987, "Growth of hight $T_c$ superconducting thin films using molecular beam epitaxy techniques" by Webb et al. pp. 1191-1193.
Appl. Phys. Lett. 51(25), Dec. 21, 1987, "Effect of noble metal buffer layers on superconducting $YBa_2Cu_3O_7$ thin films" by Chien et al., pp. 2155-2157.
Appl. Phys. Lett. 52(7), Feb. 15, 1988, "Y-Ba-Cu-O superconducting thin films by simultaneous or sequential evaporation" by Mogro-Campero et al., pp. 584-586.
J. Appl. Phys. 63(6), Mar. 15, 1988, "Processing of $La_{1.8}Sr_{0.2}CuO_4$ and $YBa_2Cu_3O_7$ superconducting thin films by dual-ion-beam sputtering" by Madakson et al., pp. 2046-2053.
J. Appl. Phys. 51(5), May 1980, "Feasibility of hybrid Josephson field transistors," by Clark et al., pp. 2736-2743.
J. Appl. Phys. 52(12), Dec. 1981, "Superconductor-normal-superconductor microbridges: Fabrication, electrical behavior, and modeling" by van Dover et al, pp. 7327-7343.
IEEE Transaction on Magnetics, vol. MAG-21, No. 2, Mar. 1985, "Study of preparation techniques for a practical microbridge dc-squid structure fabricated from $Nb_3Ge$" by Rogalla et al., pp. 536-538.
Z. Phys. B-Condensed Matter 64, 189-193 (1986), "Possible High $T_c$ Superconductivity in the Ba-La-Cu-O System" by Bednorz et al, pp. 189-193.
Physical Review Letters, vol. 58, No. 4, Jan. 26, 1987, "Bulk Superconductivity at 36K in $La_{1.8}Sr_{0.2}CuO_4$" by Cava et al.
Phyical Review Letters, vol. 58, No. 4, Jan. 26, 1987, "Evidence for Superconductivity above 40K in the La-Ba-Cu-O Compound System" by Chu et al.

*Primary Examiner*—Rolf Hille
*Assistant Examiner*—Steven Loke
*Attorney, Agent, or Firm*—Antonelli, Terry, Stout & Kraus

[57] ABSTRACT

A superconducting device has a structure of superconductor - normal-conductor (semiconductor) - superconductor. The superconductors constituting the superconducting device are made of a super-conducting oxide material of $K_2NiF_4$ type crystalline structure or perovskite type crystalline structure which contains at least one element selected from the group consisting of Ba, Sr, Ca, Mg and Ra; at least one element selected from the group consisting of La, Y, Ce, Sc, Sm, Eu, Er, Gd, Ho, Yb, Nd, Pr, Lu and Tb; Cu; and O.

16 Claims, 3 Drawing Sheets

FIG. 6(a)
FIG. 6(b)
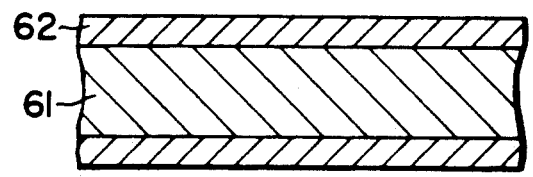
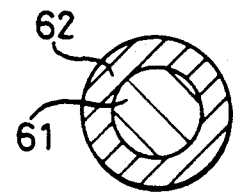
FIG. 7
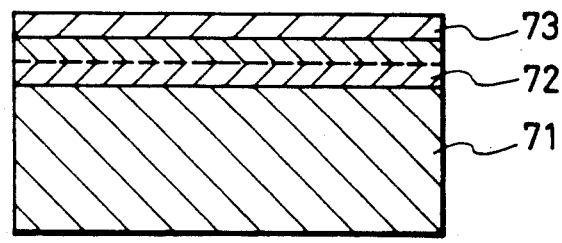
FIG. 8
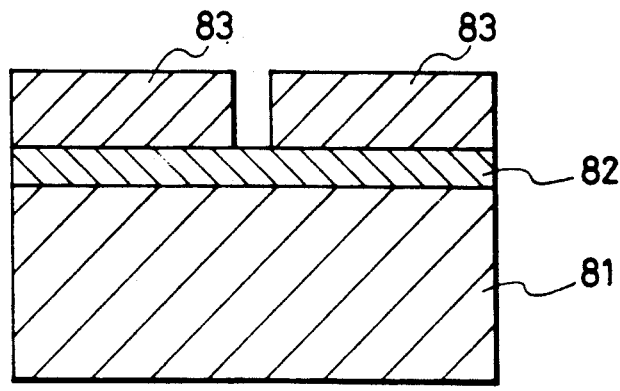

HIGH $T_c$ SUPERCONDUCTING DEVICE WITH WEAK LINK BETWEEN TWO SUPERCONDUCTING ELECTRODES

This application is a continuation of application Ser. No. 07/145,315, filed Jan. 19, 1988, now abandoned.

BACKGROUND OF THE INVENTION

1. Field of the Invention

The present invention relates to a superconducting weak link device adapted to operate at the liquid nitrogen temperature or higher temperatures, and more particularly to a high temperature superconducting device which can reduce variation in the electrical characteristics thereof attributed to manufacturing process and whose operation is stable.

2. Description of the Related Art

As the materials of superconducting weak link devices of the high temperature operation type, materials such as $Nb_3Ge$ have heretofore been used. This technique has been discussed by H. Rogalla et al in IEEE Trans. MAG-15, 536 (1985).

In addition, a superconducting device in which electrodes exhibiting superconductivity are coupled through a semiconductor or a normal-conductor has heretofore been discussed by R. B. van Dover et al in J. Appl. Phys., vol. 52, p. 7327, 1981. Besides, a three-terminal superconducting device in which the above superconducting device is additionally provided with means for changing the coupling between the electrodes exhibitive of the superconductivity on the basis of the field effect has been discussed by T. D. Clark et al in J. Appl. Phys., vol. 5, p. 2736, 1980.

In the prior-art superconducting devices mentioned above, the superconducting critical temperature ($T_c$) of the constituent superconducting material is about 23 K or so. Therefore, it is impossible in principle to use the devices at higher temperatures.

In the prior art, the superconducting electrodes and the semiconductor or normal-conductor are respectively made of materials composed of the individual combinations of elements. Accordingly, the superconducting device has the structure in which, on the surface of the semiconductor or the normal-conductor, the superconductor of different material is stacked and formed. On this occasion, the characteristics of the superconductor are susceptible to the surface state of the semiconductor or the normal-conductor. Therefore, the characteristics of the device having such a structure are prone to change, and it has been difficult to reproducibly fabricate the superconducting device of this type. Besides, the superconducting critical temperature ($T_c$) of the superconductor is at most 10–20 K or so. This signifies that the characteristics of the device are liable to become unstable due to the temperature change of the device.

Moreover, since the prior-art superconducting devices operate principally at the liquid helium temperature, they are cooled down to this temperature by a method of immersion in liquid helium or cooling with helium gas. The liquid helium, however, has posed the problems that it is very expensive and is uneconomical as a coolant and that it is, in itself, difficult of handling because of much lower temperatures than the room temperature.

These problems of the liquid helium have directly led to the problems that the superconducting devices themselves are uneconomical and are difficult of handling.

SUMMARY OF THE INVENTION

The first object of the present invention is to provide a superconducting device which operates stably against a temperature change and which can operate at high temperatures above the liquid nitrogen temperature.

The second object of the present invention is to provide a superconducting device which is excellent in economy and which is easy of handling.

The third object of the present invention is to provide a superconducting device which can be readily manufactured and which exhibits uniform electrical characteristics.

The first and second objects are accomplished in such a way that superconductors constituting the superconducting device are made of a superconducting oxide material of $K_2NiF_4$ type structure or perovskite type structure which contains at least one element selected from the group consisting of Ba, Sr, Ca, Mg and Ra; at least one element selected from the group consisting of La, Y, Ce, Sc, Sm, Eu, Er, Gd, Ho, Yb, Nd, Pr, Lu and Tb; Cu; and O.

The third object is accomplished in such a way that a semiconductor or normal-conductor in contact with the superconductors is made of the same superconducting material as mentioned above, having a different composition.

More specifically, a material having a composition denoted by $YBa_2Cu_3O_{7-x}$, $Ba_{2x}La_{2(1-x)}CuO_{4(1-y)}$ or $Sr_{2x}La_{2(1-x)}CuO_{4(1-y)}$ is employed for superconducting electrodes, and an oxide material containing Y, Ba and Cu; Ba, La and Cu; or Sr, La and Cu is used as a semiconductor or normal-conductor, respectively. In addition, a region to become the superconducting electrodes and a region to become the semiconductor or normal-conductor are formed by making the compositions thereof different beforehand, or by changing the composition of either region later through the diffusion or injection of at least one element into the material of the regions. This is based on the fact that the electrical properties of the oxide material having the composition $YBa_2Cu_3O_{7-x}$, $Ba_{2x}La_{2(1-x)}CuO_{4(1-y)}$ or $Sr_{2x}La_{2(1-x)}CuO_{4(1-y)}$ depend upon the value x.

The superconducting device of the present invention can also be realized by selecting the value x so that the superconducting critical temperature of the material of the region to become the semiconductor or normal-conductor may become lower than the operating temperature of the superconducting device (for example, 4.2 K or 77 K, or higher temperatures), or by introducing the fifth element other than the four elements which constitute the superconductors.

The material having the composition $Ba_{2x}La_{2(1-x)}CuO_{4(1-y)}$ or $Sr_{2x}La_{2(1-x)}CuO_{4(1-yk)}$ exhibits a superconducting critical temperature of about 35 K when x is 0.05. Therefore, when the material of the composition in which x=0.05 does not hold is previously formed as the normal-conductor or semiconductor and a superconductor layer in which x is about 0.05 and which has the high superconducting critical temperature is formed on the normalconductor or semiconductor in a manner to be continuous thereto, the ideal interface between the superconductors and the normal-conductor or semiconductor can be obtained, and a superconducting device including superconducting weak coupling which can be established by fabricating the superconductor layer can be endowed with very uniform and reproducible characteristics. Moreover, in a case where the superconducting device stated here is additionally provided with an insulated gate electrode for an application of electric field so as to form a field-effect type superconducting transistor, a gate insulator film can be formed by oxidizing the whole sample because the superconductor layer and the normal-conductor layer (or semiconductor layer) have substantially equal oxidation rates. This is understood to be a great advantage facilitating the manufacture of the device in view of the fact that, in a conventional device which employs an Nb or Pb alloy or the like for superconducting electrodes, the material of the superconducting electrodes is more easily oxidized than a semiconductor material.

Further, as stated before, when $YBa_2Cu_3O_{7-x}$, $Ba_{2x}La_{2(1-x)}CuO_{4(1-y)}$ or $Sr_{2x}La_{2(1-x)}CuO_{4(1-y)}$ is employed as the material which constitutes the superconducting device, the portion of the superconductors or the semiconductor or normal-conductor can be formed by diffusing or injecting at least one element. Also in this case, the interface between the portion of the superconductors and the portion of the semiconductor or normal-conductor can be formed without being exposed to the atmospheric air. Therefore, contamination etc. do not arise, and the superconducting device thus formed has uniform electrical characteristics and is excellent in reproducibility. Moreover, since the surface of the device is flattened, an insulated gate for field-effect control can be readily formed owing to the nonexistence of steps in the gate portion.

Moreover, since the superconducting critical temperature of the superconductor portion becomes higher, changes in characteristics attributed to a slight change in the operating temperature of the device decrease to be negligible, and the operation of the device can be stabilized. In this manner, according to the present invention, the superconducting device which is readily manufactured and which operates stably can be realized.

Even with a device in which La in the aforementioned material is replaced with Y, Sc, Sm, Eu, Gd, Ho, Yb, Nd, Pr, Lu or Tb or in which Ba or Sr is replaced with Ca, Mg or Ra, similar effects can be attained, and the objects of the present invention can be satisfactorily accomplished.

Further, for stably manufacturing the superconducting weak link device, it is required that the fabrication of a weak coupling portion be easy. The weak link device in which the superconductor - the normal-conductor - the superconductor are stacked in this order, is easy of manufacture. Since, however, the capacitance of the device increases, the uses thereof are limited. In particular, this device is unsuitable for application to an analog high-frequency device. Therefore, a device structure of the coplanar electrode type is adopted. In this case, the length between the two superconductors, namely, the size of microfabrication d must be 1 μm or less, and holding the accuracy thereof within 1% is an indispensable technique for enhancing device characteristics and attaining uniformities in them. Meanwhile, the size of microfabrication d needs to be changed together with the operating, temperature of the device for the purpose of keeping the operation of the device at the optimum. In the prior art, the operating temperatures of devices have been the liquid helium temperature 4.2 K or in a range of about 2–6 K almost unexceptionally It has therefore sufficed to consider them as the service temperatures and to optimize the size of microfabrication d.

In contrast, in a case where the superconducting device of the present invention is used at, for example, 77 K, the size of microfabrication d the upper limit of which is assumed to be selected at about 3–10 times the coherence length $\xi_n$ in the normal-conductor becomes as follows:

$$d < 10 \, \Xi_n \quad (1)$$

At the dirty limit case, the following holds:

$$\Xi_n \alpha T^{-\frac{1}{2}}[1+2/\ln(T/Tc')]^{\frac{1}{2}} \quad (2)$$

In the above equation, Tc' denotes the superconducting critical temperature of the material employed for the normal-conductor portion or semiconductor portion, and T denotes the operating temperature of the device. In the prior art, the normalconductor portion has been made of a material such as Au or Cu the superconducting critical temperature of which can be regarded as 0 K, a semiconductor material such as Si or InAs, or a material the superconducting critical temperature of which is lower than 4.2 K being the liquid helium temperature. In this case, accordingly, Eq. (2) becomes as follows:

$$\Xi_n \alpha T^{-\frac{1}{2}} \quad (3)$$

In a case where T is lower than 4.2 K, this does not pose a serious problem. However, when T is 77 K, $\Xi_n$ becomes less than a quarter of the value in the case of 4.2 K, and the size of microfabrication d needs to be similarly reduced to less than ¼ in accordance with Eq. (1) in this case. Therefore, the accuracy of microfabrication needs to be raised to at least four times that of the prior art. Thus, in case of employing the same accuracy of microfabrication, variation in the dimensions of the devices exceeds four times, and variation in electrical characteristics attendant thereupon becomes conspicuous when the devices are operated at 77 K, so that the yield of the devices in manufacture lowers. For solving this problem, a material of higher Tc' than in the prior art needs to be used for the normal-conductor portion or semiconductor portion. Important herein is the ratio T/Tc' between T and Tc' in view of Eq. (2). In order to keep constant or rather decrease the variation in the electrical characteristics by the use of a microfabrication technique equivalent to that of the prior art, the coherence length $\Xi_n$ may be set at a fixed value or rendered greater, and it may be selected in view of Eq. (2) so as to satisfy the following:

$$T^{-\frac{1}{2}} [1+2/\ln(T/Tc)]^{\frac{1}{2}} \geq 4.2^{-\frac{1}{2}} \quad (4)$$

For example, in the case where the operating temperature T of the device is 77 K, Tc' should desirably be 68 K or above. This lower-limit value of Tc' depends upon the accuracy of the microfabrication. However, even if the accuracy of the fabrication is raised, the coherence length of the superconductors serves as one criterion for the lower limit. When the length value is the criterion, the size of microfabrication d needs to be at least 5 times this value, and the temperature Tc' needs to meet:

$$\left(\frac{4.2}{T}\right)^{\frac{1}{2}} [1 + 2/\ln(T/Tc')]^{\frac{1}{2}} \geq \frac{1}{5} \quad (5)$$

When T is 300 K, Tc' may be 102 K or above.

As understood from the foregoing description, Tc' needs to satisfy Eq. (4) or Eq. (5) for the purpose of operating the superconducting weak link device at the high temperature of 77 K or above. By way of example, for operating the device at 77 K, Tc' needs to have a finite value and may desirably be 68 K or above. In general, Eq. (5) needs to be satisfied. In the prior art, such a high-temperature operation is not taken into consideration. As another method of increasing the coherence length $\xi_n$, there is a method in which the Fermi velocity $v_F$ or carrier mean free path $l_n$ of a material is enlarged. Merely with this method, however, in the case where T is 300 K, devices of uniform characteristics are difficult of manufacture, and the conditions of Eqs. (4) and (5) cannot be met. In contrast, according to the present invention, the conditions of Eqs. (4) and (5) can be simultaneously met. Besides, especially the problem that $\xi_n$ decreases with the increase of temperature in proportion to $T^{-\frac{1}{2}}$, so a high degree of microfabrication is necessitated to augment the variation of the electrical characteristics of devices, can be readily solved by the present invention.

According to the present invention, a device can be manufactured while the interface between a superconductor and a normal-conductor or semiconductor is kept clean, the superconducting critical temperature of the superconductor is high, and the normal-conductor portion or semiconductor portion can be formed flat. Accordingly, there is the effect that the superconducting device whose characteristics are stable, which can be reproducibly manufactured and which operates stably even against fluctuation in temperature can be realized.

BRIEF DESCRIPTION OF THE DRAWINGS

FIGS. 6(a) and 6(b) sectional views showing a part of a superconducting device according to the sixth embodiment of the present invention;

FIG. 7 is a sectional view showing a part of a superconducting device according to the seventh the embodiment of the present invention; and FIG. 8 is a sectional view showing a part of a superconducting device according to the eighth embodiment of the present invention.

DESCRIPTION OF THE PREFERRED EMBODIMENTS

Now, the embodiments of the present invention will be described with reference to the drawings.

Figure 1:
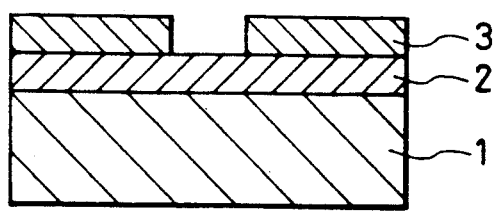
FIG. 1 is a sectional view showing a part of a superconducting device according to the first embodiment of the present invention.

FIG. 1 is a view showing a part of a superconducting device according to the first embodiment of the present invention. On a substrate 1 made of sapphire, a normal-conductor layer or semiconductor layer 2 made of a composition $Ba_{2x}La_{2(1-x)}CuO_{4(1-y)}$ (x=0.5) and having a thickness of about 100 nm is formed by sputtering. This normal-conductor layer or semiconductor layer 2 is formed on the flat substrate 1, and the thickness thereof is uniform. A single-crystal material, for example, $SrTiO_3$ of (100) orientation may well be employed for the substrate 1. Used as a target material for the sputtering is a disc-like compact into which oxides of Ba, La and Cu pulverized and mixed are shaped by a press. A mixed gas consisting of Ar and $O_2$ is used during the sputtering, and the value y can be changed by altering the partial pressure of oxygen on this occasion. Subsequently, a superconductor layer 3 of $Ba_{2x}La_{2(1-x)}CuO_{4(1-y)}$ (x=0.05) is formed similarly by sputtering and without breaking vacuum. A pattern of photoresist is formed on the surface of this superconductor layer 3, and using it as a mask, sputter-etching with Ar ions is carried out to remove a part of the superconductor layer 3, whereby two superconducting electrodes opposing to each other are formed. In consequence, a space is defined between the two superconducting electrodes. In this way, a diode type superconducting device having a structure of the superconductor - the normal-conductor (semiconductor) - the superconductor can be obtained. In this case, since the normal-conductor layer 2 and the superconductor layer 3 are continuously formed, the interface between both the layers is free from contamination etc. and can be formed in an ideal state. Accordingly, the device is excellent in the uniformity and reproducibility of electrical characteristics. Another effect is that, since the material of high superconducting critical temperature is used for the superconductor layer, the operation of the device is stabilized.

Figure 2:
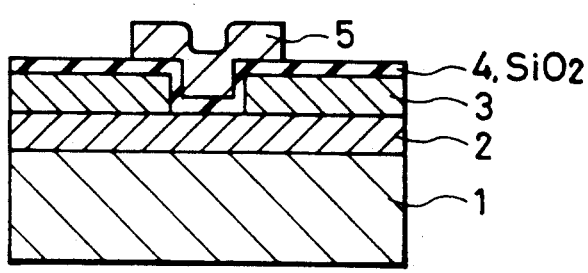
FIG. 2 is a sectional view showing a part of a superconducting device according to the second embodiment of the present invention.

Next, the second embodiment of the present invention will be described with reference to FIG. 2. The upper surface of the superconducting device in FIG. 1 is heated and oxidized in pure oxygen, to form an insulator film 4 being 20-80 nm thick. Subsequently, a gate electrode 5 made of an Al evaporated film having a thickness of about 3000 nm is formed between the two superconducting electrodes 3. This gate electrode controls current which flows across the two superconducting electrodes. Thus, a transistor type superconducting device with three terminals can be realized. The present embodiment shown in FIG. 2 concerns the superconducting device of the field effect type having the gate electrode. In this case, likewise to the case of FIG. 1, the normal-conductor layer 2 and the superconductor layer 3 are made of the same elements, so that the growth rate of the oxide film 4 is substantially uniform. Accordingly, the superconducting device the oxide film 4 of which has a uniform thickness can be readily realized.

Figure 3A:
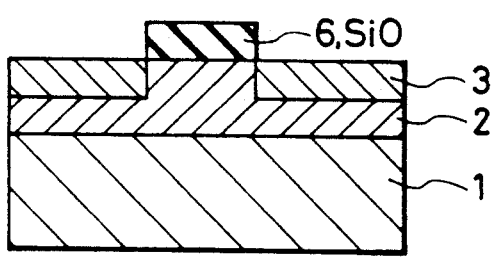
FIGS. 3(a)-3(c) are section views showing parts of a superconducting device according to the third embodiment of the present invention.
Figure 3B:
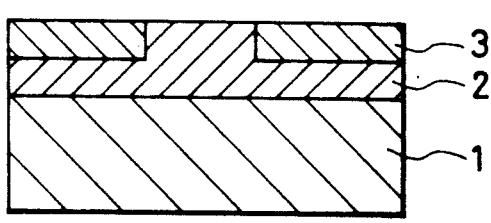
Figure 3C:
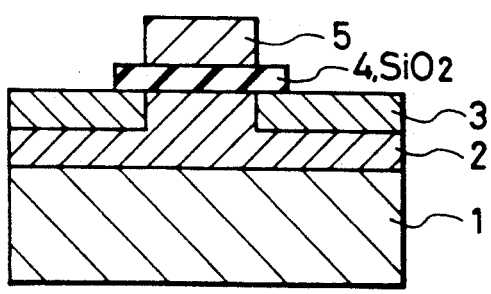

The third embodiment of the present invention will be described with reference to FIGS. 3(a)-3(c). In the embodiments of FIGS. 1 and 2, the normal-conductor layer 2 and the superconductor layer 3 have been individually formed by making the compositions of the materials thereof slightly different. The same structure can also be realized in such a way that only one of the normal-conductor layer 2 and the superconductor layer 3 is formed beforehand, whereupon the other is formed using the diffusion or injection of an element or elements which constitutes or constitute the formed material. That is, the present embodiment corresponds to a case where the normal-conductor layer 2 is previously formed and where the composition thereof is subsequently changed In FIG. 3(a), a normalconductor layer 2 made of a composition $Ba_{2x}La_{2(1-x)}CuO_{4(1-y)}$ ($x=0.05$, $y>0$) and having a thickness of about 200 nm is formed on a substrate 1 of sapphire by sputtering. Subsequently, an insulator film 6 of SiO having a thickness of about 250 nm is formed by evaporation, and using it as a mask, oxygen ions are injected to form a superconductor layer 3 the composition of which is of $y=0$. Thereafter, the insulator film 6 is removed. Then, as shown in FIG. 3, the diode type superconducting device having the same structure as in FIG. 1 can be realized An insulator film 4 made of $SiO_2$ and having a thickness of about 20-80 nm is formed on the upper surface of this device by sputtering. Lastly, a gate electrode 5 made of an Al evaporated film about 300 nm thick is formed on the part of the insulator film 4 between the two superconductors 3. Then, as shown in FIG. 3(c), the superconducting device constructed similarly to the embodiment of FIG. 2, namely, the field effect type superconducting transistor can be fabricated.

Figure 4A:
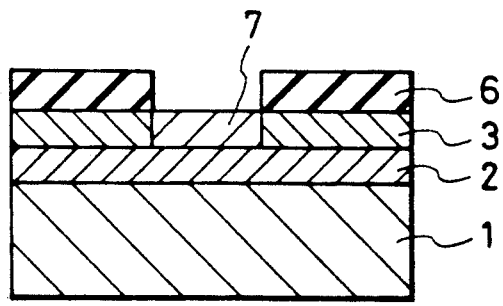
FIGS. 4(a)-4(c) are sectional views showing parts of a superconducting device according to the fourth embodiment of the present invention.
Figure 4B:
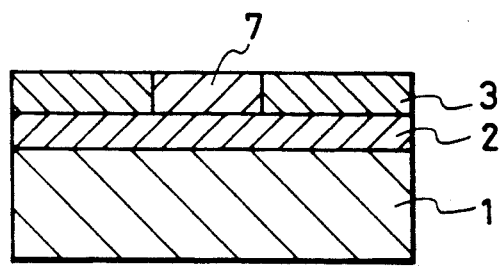
Figure 4C:
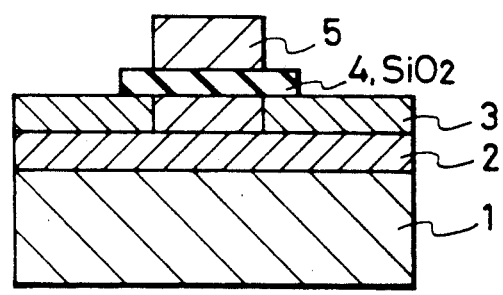

The fourth embodiment of the present invention will be described with reference to FIGS. 4(a)-4(c). Whereas the third embodiment in FIGS. 3(a)-3(c) has previously formed the normal-conductor layer 2 and thereafter changed its composition to form the superconductor layer 3, the present embodiment forms the superconductor layer 3 in advance and diffuses or injects atoms thereinto to form the normal-conductor layer 2. On a substrate 1 made of sapphire, a normal-conductor layer 2 having a composition $Ba_{2x}La_{2(1-x)}CuO_{4(1-y)}$ ($x=0.05$, $y>0$) and a superconductor layer 3 having the same composition except $y=0$ are respectively formed to thicknesses of about 100 nm, whereupon using as a mask the same insulator film 6 of $SiO_2$ as in FIG. 3(a), Ba ions are injected to form a normal-conductor layer 7 (FIG. 4(a)). By removing the insulator film 6, the diode type superconducting device of the same structure as in FIG. 3(b) be obtained (FIG. 4(b)). In addition, by adding an oxide film 4 and a gate electrode 5 as shown in FIG. 4(c), the field effect type superconducting device of the same structure as in FIG. 3(c) can be obtained.

Next, the fifth embodiment of the present invention will be described with reference to FIG. 5. The present embodiment is a magneto-flux meter which employs the diode type superconducting devices 51 and 52 of the present invention. The two superconducting devices 51 and 52 are connected with each other so as to form a closed loop. This closed loop is supplied with electric power from a power source terminal 53. Shown at numeral 55 is a ground point. The detection signal of the closed loop is delivered from an output end 54. A detecting coil 56 detects a magnetic flux to-be-measured 58. Connected to the detecting coil 56 is a coupling coil 57, which feeds the closed loop with a magnetic flux corresponding to the magnetic flux 58. Superconductor parts included in this magneto-flux meter, that is, wiring to the power source terminal 53 as well as the output terminal 54, the detecting coil 56, the coupling coil 57, and wiring between both the coils 56, 57 are all made of thin films of a superconducting material having a composition $Ba_{2x}La_{2(1-x)}CuO_{4(1-y)}$ ($x=0.05$). As a result, the detecting coil 56 of this magnetometer operates at temperatures up to 35 K. Also, as the whole magneto-flux meter, characteristics fluctuate little due to fluctuation in temperature, and a stable operation can be realized.

The sixth embodiment of the present invention will be described with reference to FIGS. 6(a) and 6(b). A Cu alloy containing several wt. % to about 18 wt. % of La is sintered in vacuum, and is turned into a solid solution. Thereafter, the solid solution is rolled or wire-drawn into a desired wire rod 61. A solution in which the powder of the carbonate or acetate of Ba (or Sr) dissolved in pentyl acetate is applied on the surface of the wire rod 61 to a thickness of several μm by spray coating, and it is sufficiently dried. Thereafter, the resulting wire rod is slowly heat-treated at 900° C. in a reduced-pressure atmosphere for about 6 hours. The surface of the wire rod is subsequently washed with dilute acetic acid, whereby a superconductor layer 62 made of $(La_{1-x}Ba_x)_2CuO_{4(1-y)}$ (or $(La_{2(1-x)}Sr_{2x}CuO_4)$ having the $K_2NiF_4$ crystalline structure is formed on the surface of the Cu alloy. The superconducting critical temperature of the superconductor layer 62 is 20-30 K.

Figure 5:
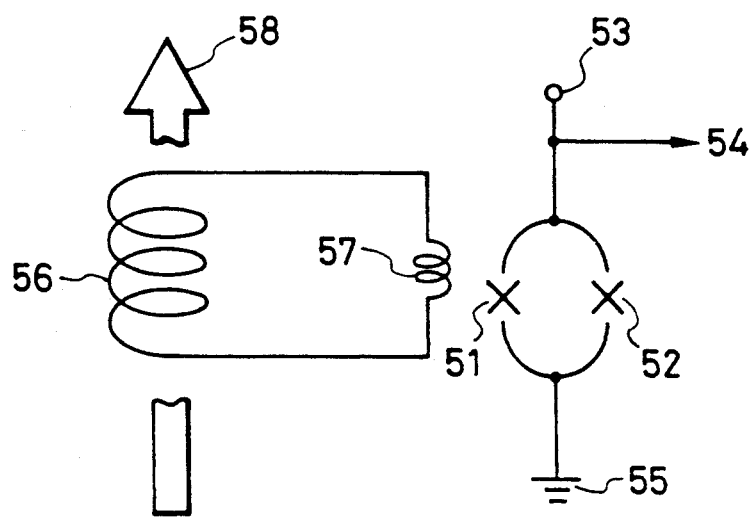
FIG. 5 is a setup diagram of a magneto-flux meter employing the superconducting devices of the present invention in the fifth embodiment of the present invention.

The superconducting wire material thus fabricated can be used for the detecting coil 56 in the embodiment of the present invention shown in FIG. 5. Besides, by manufacturing a wire material in accordance with such a construction, the continuous wire material of high critical temperature can be formed, so that the present wire material can be used for a superconducting magnet, a power transmission line, etc.

The present embodiment has employed the Cu-La alloy in the shape of the wire rod. Needless to say, however, when the Cu-La alloy in the shape of a thin film is employed, the construction of the first embodiment shown in FIG. 1 can be readily realized by forming the superconductor layer on the surface of the thin film and microfabricating the layer.

Next, the seventh embodiment of the present invention will be described with reference to FIG. 7. On an insulator substrate 71 of $SiO_2$, $Al_2O_3$ or the like, La is first vacuum-evaporated, and Cu is subsequently vacuum-evaporated, whereby the substrate 71 is covered with the double-layer film 72 of La-Cu which is about 300 nm thick as a whole. On this occasion, the ratio between the thicknesses of the Cu/La layers is set at about 10/64 or above. $BaCO_3$ or $SrCO_3$ powder dissolved in pentyl acetate is applied on the upper surface of the resulting structure by spray coating and is dried. Thereafter, the resulting structure is slowly heated at 900° C. in a reduced-pressure atmosphere for 1 hour, whereupon the surface thereof is washed with dilute acetic acid. Then, a superconductor layer 73 of $Ba_{2x}La_{2(1-x)}CuO_{4(1-y)}$ or $Sr_{2x}La_{2(1-x)}CuO_{4(1-y)}$ having the $K_2NiF_4$ crystalline structure can be formed on the surface. The superconductor layer 73 has a high superconducting critical temperature of 20-30 K, and by the microfabrication thereof, the construction of the first embodiment shown in FIG. 1 can be readily realized. Further, it is to be understood that the superconducting device having the construction shown in FIG. 2 can be readily realized by forming an insulator film and a gate electrode.

Moreover, when the double-layer film 72 of La-Cu is fabricated into a pattern beforehand, the superconductor having the K$_2$NiF$_4$ structure can be formed on only the corresponding part, so that a superconducting wire or circuit of high superconducting critical temperature can be readily manufactured.

In the superconductors employed in the foregoing embodiments, La may well be replaced with Y, Sc, Sm, Eu, Er, Gd, Ho, Yb, Nd, Pr, Lu or Tb. Even when Ba or Sr is replaced with Ca, Mg or Ra, the objects of the present invention can be achieved.

Next, the eighth embodiment of the present invention will be described with reference to FIG. 8. On a substrate 81 made of sapphire, a thin film for normal conduction 82 made of Ba$_{2x}$La$_{2(1-x)}$Cu O$_{4(1-y)}$ ($x=0.05$) and having a thickness of about 100 nm is formed by sputtering. A method for the formation may be the same as described in the embodiment of the present invention in FIG. 1. The superconducting critical temperature Tc' of the normal-conducting thin film 82 is 39 K. Subsequently, a superconducting thin film 83 of a composition YBa$_2$Cu$_3$O$_{7-x}$ at a thickness of about 200 nm is formed similarly by sputtering. The superconducting critical temperature Tc of the superconducting thin film 83 is 94 K. A pattern of photoresist is formed on the film 83, and using it as a mask, sputter-etching with Ar ions is carried out to process the superconducting thin film 83 into two superconducting electrodes opposing to each other. In this way, the structure of the superconductor - the normal-conductor (second superconductor) - the superconductor can be realized. In the present embodiment, the superconducting critical temperature Tc' of the second superconductor functioning as the normal-conductor has been 39 K, but it is a matter of course that the temperature may well be a lower value within the range fulfilling Eq. (5). The composition of the superconducting thin film 83 is not restricted to the aforementioned one, either. Regarding the constituent elements, it is needless to say that Ba may well be replaced with Sr, Ca, Mg or Ra and that Y may well be replaced with one or more elements selected from the group consisting of elements La, Se, Sm, Eu, Gd, Ho, Yb, Nd, Pr, Lu and Tb. Such examples are listed in Table 1.

TABLE 1

| Semiconductor (Normal-conductor) | | Superconductor | |
| --- | --- | --- | --- |
| EuBa$_2$Cu$_3$O$_{7-y}$ | $y > 0.5$ | EuBa$_2$Cu$_3$O$_{7-y}$ | $0 < y < 0.5$ |
| EuSr$_2$Cu$_3$O$_{7-y}$ | $y > 0.5$ | EuSr$_2$Cu$_3$O$_{7-y}$ | $0 < y < 0.5$ |
| HoBa$_2$Cu$_3$O$_{7-y}$ | $y > 0.5$ | HoBa$_2$Cu$_3$O$_{7-y}$ | $0 < y < 0.5$ |
| HoSr$_2$Cu$_3$O$_{7-y}$ | $y > 0.5$ | HoSr$_2$Cu$_3$O$_{7-y}$ | $0 < y < 0.5$ |
| GdBa$_2$Cu$_3$O$_{7-y}$ | $y > 0.5$ | GdBa$_2$Cu$_3$O$_{7-y}$ | $0 < y < 0.5$ |
| GdSr$_2$Cu$_3$O$_{7-y}$ | $y > 0.5$ | GdSr$_2$Cu$_3$O$_{7-y}$ | $0 < y < 0.5$ |
| YbBa$_2$Cu$_3$O$_{7-y}$ | $y > 0.5$ | YbBa$_2$Cu$_3$O$_{7-y}$ | $0 < y < 0.5$ |
| YbSr$_2$Cu$_3$O$_{7-y}$ | $y > 0.5$ | YbSr$_2$Cu$_3$O$_{7-y}$ | $0 < y < 0.5$ |
| TbBa$_2$Cu$_3$O$_{7-y}$ | $y > 0.5$ | TbBa$_2$Cu$_3$O$_{7-y}$ | $0 < y < 0.5$ |
| TbSr$_2$Cu$_3$O$_{7-y}$ | $y > 0.5$ | TbSr$_2$Cu$_3$O$_{7-y}$ | $0 < y < 0.5$ |
| NdCa$_2$Cu$_3$O$_{7-y}$ | $y > 0.5$ | NdCa$_2$Cu$_3$O$_{7-y}$ | $0 < y < 0.5$ |
| NdSr$_2$Cu$_3$O$_{7-y}$ | $y > 0.5$ | NdSr$_2$Cu$_3$O$_{7-y}$ | $0 < y < 0.5$ |
| SmBa$_2$Cu$_3$O$_{7-y}$ | $y > 0.5$ | SmBa$_2$Cu$_3$O$_{7-y}$ | $0 < y < 0.5$ |
| SmSr$_2$Cu$_3$O$_{7-y}$ | $y > 0.5$ | SmSr$_2$Cu$_3$O$_{7-y}$ | $0 < y < 0.5$ |
| Ba$_{2x}$La$_{2(1-x)}$CuO$_{4(1-y)}$ | $x > 0.05$ | Ba$_{2x}$La$_{2(1-x)}$CuO$_{4(1-y)}$ | $x = 0.05$ |
| Sr$_{2x}$La$_{2(1-x)}$CuO$_{4(1-y)}$ | $x > 0.05$ | Sr$_{2x}$La$_{2(1-x)}$CuO$_{4(1-y)}$ | $x = 0.05$ |
| Ca$_{2x}$La$_{2(1-x)}$CuO$_{4(1-y)}$ | $x > 0.05$ | Ca$_{2x}$La$_{2(1-x)}$CuO$_{4(1-y)}$ | $x = 0.05$ |
| Ba$_{2x}$Y$_{2(1-x)}$CuO$_{4(1-y)}$ | $x > 0.05$ | Ba$_{2x}$Y$_{2(1-x)}$CuO$_{4(1-y)}$ | $x = 0.05$ |
| Sr$_{2x}$Y$_{2(1-x)}$CuO$_{4(1-y)}$ | $x > 0.05$ | Sr$_{2x}$Y$_{2(1-x)}$CuO$_{4(1-y)}$ | $x = 0.05$ |
| Ba$_{2x}$Eu$_{2(1-x)}$CuO$_{4(1-y)}$ | $x > 0.05$ | Ba$_{2x}$Eu$_{2(1-x)}$CuO$_{4(1-y)}$ | $x = 0.05$ |
| Sr$_{2x}$Eu$_{2(1-x)}$CuO$_{4(1-y)}$ | $x > 0.05$ | Sr$_{2x}$Eu$_{2(1-x)}$CuO$_{4(1-y)}$ | $x = 0.05$ |
| Ba$_{2x}$Eu$_{2(1-x)}$CuO$_{4(1-y)}$ | $x > 0.05$ | Ba$_{2x}$Eu$_{2(1-x)}$CuO$_{4(1-y)}$ | $x = 0.05$ |

What is claimed is:

1. A superconducting device comprising:
a substrate;
a body selected from the group consisting of a semiconductor material and a normal-conductor material, said body being formed on said substrate and being made of an oxide of a crystalline structure type selected from the group consisting of a perovskite type and K$_2$NiF$_4$ type, containing at least one element selected from the group consisting of Ba, Sr, Ca, Mg and Ra; at least one element selected from the group consisting of La, Y, Ce, Sc, Sm, Eu, Er, Gd, Ho, Yb, Nd, Pr, Lu and Tb; Cu; and O; and
at least two superconductor regions formed in contact with said body, said at least two superconducting regions being spaced from each other so as to form superconducting weak coupling through said body and being made of the oxide having the same elements and the crystalline structure type of those of said body, wherein said at least two superconducting regions and said body have different compositions.

2. A superconducting device according to claim 1, wherein:
said body is a layer of fixed thickness which is formed on a flat surface of said substrate.

3. A superconducting device according to claim 1, wherein the oxide material of which said superconductor regions and said body are made has a composition Ba$_{2x}$La$_{2(1-x)}$CuO$_{4(1-y)}$.

4. A superconducting device according to claim 1, wherein the oxide material of which said superconductor regions and said body are made has a composition Sr$_{2x}$La$_{2(1-x)}$CuO$_{4(1-y)}$.

5. A superconducting device according to claim 1, wherein the oxide material, of which said superconductor regions and said body are made has a composition YBa$_2$Cu$_3$O$_{7-x}$.

6. A superconducting device according to claim 1, wherein letting T denote a service temperature of said device, and Tc' denote a superconducting critical temperature of said body, the following equation is fulfilled:

$$R^{-\frac{1}{2}}[1+2/\ln(T/Tc')]^{\frac{1}{2}} \geq 1/5(4.2^{-\frac{1}{2}}).$$

7. A superconducting device according to claim 1, wherein said superconductor regions are spaced from each other at a distance of 3 to 10 times a coherence length of a superconducting electron pair in said body.

8. A superconducting device comprising:
a substrate;
a body selected from the group consisting of a semiconductor material and a normal-conductor material, being formed on said substrate and being made of an oxide of a crystalline structure type selected from the group consisting of a perovskite type and K$_2$NiF$_4$ type, containing at least one element selected from the group consisting of Ba, Sr, Ca, Mg and Ra; at least one element selected from the group consisting of La, Y, Ce, Sc, Sm, Eu, Er, Gd, Ho, Yb, Nd, Pr, Lu and Tb; Cu; and O;
at least two superconductor regions formed in contact with said body, said at least two superconducting regions being spaced from each other so as to form superconducting weak coupling through said body and being made of the oxide having the same elements and the crystalline structure type of those of said body, wherein said at least two superconducting regions and said body have different compositions; and control means for controlling current flowing between said superconductor regions, said control means being formed on said body and is separated therefrom by an electric insulator film.

9. A superconducting device according to claim 8, wherein:

said body is a layer of fixed thickness which is formed on a flat surface of said substrate.

10. A superconducting device according to claim 8, wherein the oxide material of which said superconductor regions and said body are made has a composition $Ba_{2x}La_{2(1-x)}CuO_{4(1-y)}$.

11. A superconducting device according to claim 8, wherein the oxide material of which said superconductor regions and said body are made has a composition $Sr_{2x}La_{2(1-x)}CuO_{4(1-y)}$.

12. A superconducting device according to claim 8, wherein the oxide material of which said superconductor regions and said body are made has a composition $YBa_2Cu_3O_{7-x}$.

13. A superconducting device according to claim 8, wherein letting T denote a service temperature of said device, and Tc' denote a superconducting critical temperature of said body the following equation is fulfilled:

$$T^{-\frac{1}{2}}[1+2/\ln(T/Tc')]^{\frac{1}{2}} \geq 1/5(4.2)^{-\frac{1}{2}}.$$

14. A superconducting device according to claim 8, wherein said superconductor regions are spaced from each other at a distance of 3 to 10 times a coherence length of a superconducting electron pair in said body.

15. A superconducting device according to claim 8, wherein said electric insulator film has a thickness of 20 to 80 nanometers.

16. A magneto-flux meter comprising:

a closed loop having two superconducting devices connected to each other, each of said superconductor devices comprising:

a substrate;

a body selected from the group consisting of a semiconductor material and a normal-conductor material, said body being formed on said substrate and being made of an oxide of a crystalline structure type selected from the group consisting of a perovskite type and $K_2NiF_4$ type, containing at least one element selected from the group consisting of Ba, Sr, Ca, Mg and Ra; at least one element selected from the group consisting of La, Y, Ce, Sc, Sm, Eu, Er, Gd, Ho, Yb, Nd Pr, Lu and Tb; Cu; and O;

at least two superconductor regions formed in contact with said body, said at least two superconducting regions being spaced from each other so as to form superconducting weak coupling through said body and being made of the oxide having the same elements and crystalline structure type of those of said body, wherein said at least two superconducting regions and said body have different compositions;

power source terminals which supply electric power to said closed loop incorporated thereacross;

an output terminal which delivers a detection signal from said closed loop;

a detecting coil which detects a magnetic flux to-be-measured; and a coupling coil which is connected to said detecting coil and which feeds said closed loop with a magnetic flux proportional to the magnetic flux to-be-measured;

said detecting coil, said coupling coil, and wiring among the various constituents being made of thin films of the oxide which has the same composition as that of said superconductor regions.

* * * * *